United States Patent
Okamoto et al.

(10) Patent No.: US 10,734,373 B2
(45) Date of Patent: Aug. 4, 2020

(54) SEMICONDUCTOR INTEGRATED CIRCUIT DEVICE

(71) Applicant: SOCIONEXT INC., Kanagawa (JP)

(72) Inventors: Atsushi Okamoto, Yokohama (JP); Tomoyasu Kitaura, Yokohama (JP); Hirotaka Takeno, Yokohama (JP)

(73) Assignee: SOCIONEXT INC., Kanagawa (JP)

( * ) Notice: Subject to any disclaimer, the term of this patent is extended or adjusted under 35 U.S.C. 154(b) by 15 days.

(21) Appl. No.: 16/189,900

(22) Filed: Nov. 13, 2018

(65) Prior Publication Data

US 2019/0081029 A1    Mar. 14, 2019

Related U.S. Application Data

(63) Continuation of application No. PCT/JP2017/019015, filed on May 22, 2017.

(30) Foreign Application Priority Data

Jun. 1, 2016   (JP) .................................. 2016-110402
Apr. 10, 2017  (JP) .................................. 2017-077462

(51) Int. Cl.
*H01L 27/02*   (2006.01)
*G06F 1/26*    (2006.01)
(Continued)

(52) U.S. Cl.
CPC ............ *H01L 27/0207* (2013.01); *G06F 1/26* (2013.01); *G06F 30/39* (2020.01); *G06F 30/392* (2020.01);
(Continued)

(58) Field of Classification Search
CPC ........... H01L 27/0207; H01L 27/11807; H01L 23/5286; H01L 2027/11881; G06F 30/39;
(Continued)

(56) References Cited

U.S. PATENT DOCUMENTS

| | | | |
|---|---|---|---|
| 7,279,926 B2* | 10/2007 | Severson | ........... H03K 19/0016 257/206 |
| 8,191,026 B2* | 5/2012 | Motomura | ............ H01L 27/092 716/101 |

(Continued)

FOREIGN PATENT DOCUMENTS

| | | |
|---|---|---|
| JP | 2007-095787 A | 4/2007 |
| JP | 2008-277788 A | 11/2008 |

(Continued)

OTHER PUBLICATIONS

Partial English translation of International Search Report issued in International Application No. PCT/JP2017/019015 dated Jun. 27, 2017.

*Primary Examiner* — Mohammad R Alam

(74) *Attorney, Agent, or Firm* — McDermott Will & Emery LLP

(57) ABSTRACT

A circuit block including standard cells (1) arranged therein is provided with switch cells (20) capable of switching between electrical connection and disconnection between power supply lines (3) extending in an X-direction and power supply straps (11) extending in a Y-direction. Each of the power supply straps (11) is provided with a single switch cell (20) arranged every M sets of power supply lines (3) (M is an integer of 3 or more). In the Y-direction, the switch cells (20) are arranged at different positions in the power supply straps (11) adjacent to each other, and are arranged at the same position every M power supply straps (11) in the X-direction.

12 Claims, 14 Drawing Sheets

(51) Int. Cl.
*H01L 27/118* (2006.01)
*G06F 30/39* (2020.01)
*G06F 30/392* (2020.01)
*G06F 30/394* (2020.01)
*H01L 23/528* (2006.01)
*H03K 19/00* (2006.01)

(52) U.S. Cl.
CPC ........ *G06F 30/394* (2020.01); *H01L 23/5286* (2013.01); *H01L 27/11807* (2013.01); *H03K 19/0016* (2013.01); *H01L 2027/11881* (2013.01)

(58) Field of Classification Search
CPC ........ G06F 30/392; G06F 30/394; G06F 1/26; H03K 19/0016
See application file for complete search history.

(56) References Cited

U.S. PATENT DOCUMENTS

| | | |
|---|---|---|
| 2007/0074134 A1 | 3/2007 | Katoh |
| 2008/0246108 A1 | 10/2008 | Sakurabayashi |
| 2009/0072888 A1 | 3/2009 | Ogata |
| 2009/0115394 A1 | 5/2009 | Ogata |
| 2010/0156503 A1 | 6/2010 | Kitaura |
| 2012/0161856 A1* | 6/2012 | Ramachandran ... H01L 23/5286 327/530 |
| 2017/0336845 A1* | 11/2017 | Raj .......................... G06F 1/28 |

FOREIGN PATENT DOCUMENTS

| | | |
|---|---|---|
| JP | 2009-076501 A | 4/2009 |
| JP | 2009-117625 A | 5/2009 |
| JP | 2009-152453 A | 7/2009 |

* cited by examiner

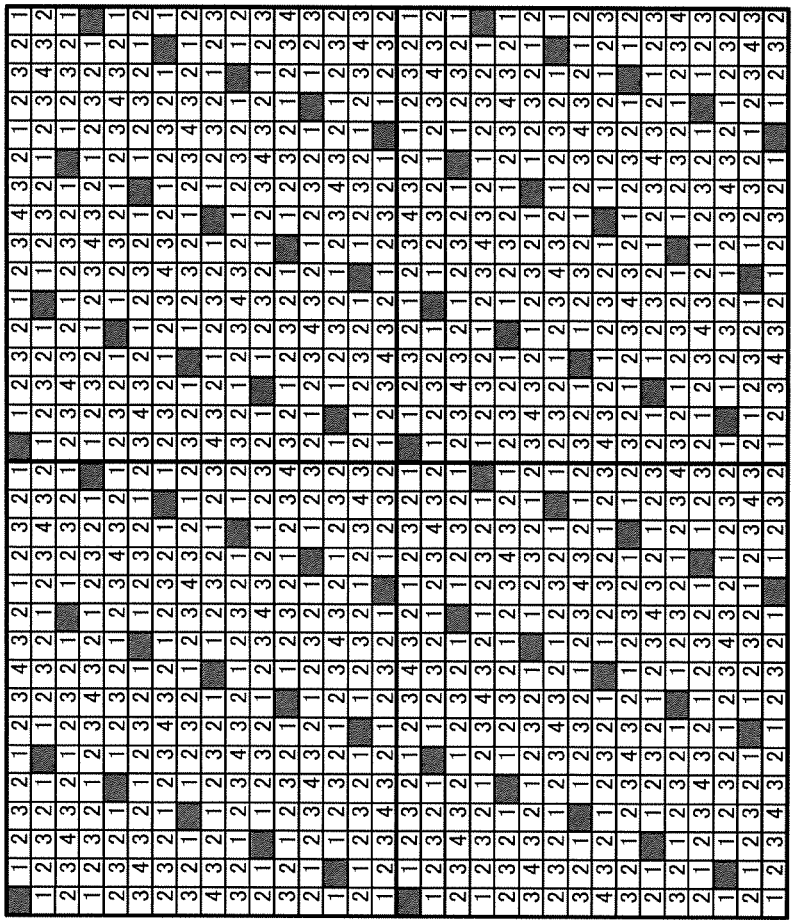
FIG. 15C M=16
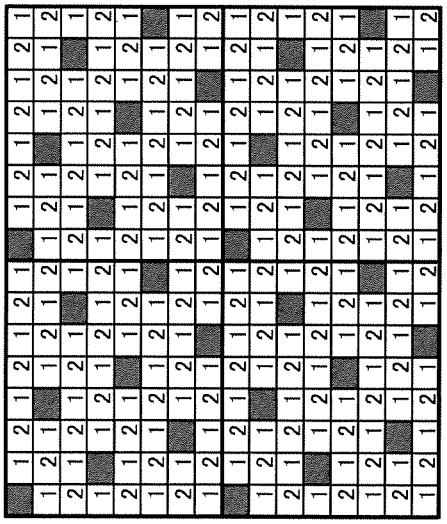
FIG. 15A M=8
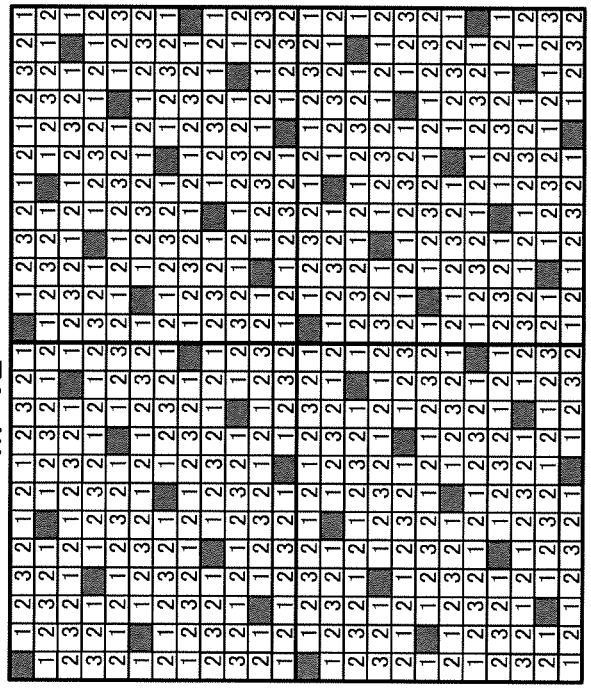
FIG. 15B M=12

SEMICONDUCTOR INTEGRATED CIRCUIT DEVICE

CROSS-REFERENCE TO RELATED APPLICATIONS

This is a continuation of International Application No. PCT/JP2017/19015 filed on May 22, 2017, which claims priority to Japanese Patent Application No. 2016-110402 filed on Jun. 1, 2016 and Japanese Patent Application No. 2017-077465 filed on Apr. 10, 2017. The entire disclosures of these applications are incorporated by reference herein.

BACKGROUND

The present disclosure relates to a technology for gating power supply in a semiconductor integrated circuit device.

Power gating is one of techniques for reducing power consumption of a semiconductor integrated circuit device. Through the power gating, internal circuitry of a semiconductor integrated circuit device is divided into a plurality of circuit blocks, and power supply to non-operating blocks is shut off, thereby reducing leakage current that leads to an increase of power consumption. Japanese Unexamined Patent Publication No. 2008-277788 discloses a configuration in which switches for supplying/shutting-off power are respectively provided for rows of standard cells in a power shut-off region to achieve power supply control. Each of the standard cells receives power from a power supply strap via the switch and a standard cell power supply line.

SUMMARY

According to the configuration of Japanese Unexamined Patent Publication No. 2008-277788, a switch for supplying/shutting-off power is required for each of the standard cell power supply lines in a circuit block to which power supply is to be gated. Specifically, multiple switches need to be arranged in the circuit block. Thus, the switches occupy a large area to increase the entire area of the circuit block, and the presence of the multiple switches reduces the flexibility of layout of the standard cells. This may bring about problems such as the increase in the area caused by the multiple switches, and the increase in the number of man hours required for design due to timing closure difficulties derived from the decrease in the flexibility of layout of the standard cells.

In addition, since the amount of current that can be fed to each switch is fixed, the number of switches to be arranged in the circuit block can be set to the requisite minimum based on the total amount of current in the circuit block. However, in this case, a distance between the switches may become long depending on the positions of the switches, and a great voltage drop may occur in the power supply lines between the switches. Such a power supply voltage drop is unfavorable because it causes malfunctions of circuits.

The present disclosure is directed to effectively reduce the possibility of the power supply voltage drop while reducing the number of switches to be arranged in a semiconductor integrated circuit device to which a power gating technique is applied.

According to an aspect of the present disclosure, a semiconductor integrated circuit device includes: a plurality of standard cell rows, each of which includes a plurality of standard cells arranged in a first direction, arranged in a second direction perpendicular to the first direction; a plurality of power supply lines extending in the first direction, and supplying power to the plurality of standard cells, a plurality of power supply straps extending in the second direction in a layer above the plurality of power supply lines; a plurality of sub-power supply straps extending in the second direction in a layer above the plurality of power supply lines and respectively connected to the plurality of power supply lines; and a plurality of switch cells provided between any one of the plurality of power supply straps and a set of N power supply line(s) (N is an integer of 1 or more) of the plurality of power supply lines, the switch cells being capable of switching between electrical connection and disconnection between the power supply strap and the power supply lines making the set in accordance with a control signal, wherein each of the plurality of power supply straps is provided with one of the plurality of switch cells arranged every M sets of power supply lines (M is an integer of 3 or more), and in the second direction, the switch cells are arranged at different positions in the power supply straps adjacent to each other, and are arranged at the same position every M power supply straps in the first direction.

According to this aspect, each of the plurality of power supply straps is provided with one of the plurality of switch cells arranged every M sets of power supply lines (M is an integer of 3 or more). More specifically, the number of switch cells to be arranged is small. Furthermore, the switch cells in the power supply straps adjacent to each other are arranged at different positions in the second direction, which is the extension direction of the power supply straps, and are arranged at the same position every M power supply straps. Thus, even in a case where the standard cells are distant from the switch cells provided for the power supply lines to which they are connected, the switch cells provided for the adjacent power supply lines are arranged in the vicinity thereof. Accordingly, power is supplied from the switch cells through the sub-power supply straps, as a result of which the possibility of power supply voltage drop can be reduced. Therefore, the possibility of power supply voltage drop in each of the standard cells can be reduced while reducing the number of switch cells.

Furthermore, the semiconductor integrated circuit device of the above-described aspect may be configured such that the plurality of switch cells includes a first switch cell and a second switch cell which are adjacent to each other in the first direction and respectively provided for a first set of power supply lines that is one of the sets of power supply lines, and a third switch cell provided for the set of power supply lines adjacent to the first set of power supply lines in the second direction, and the third switch cell is provided for the power supply strap that is at a midpoint position of the power supply strap provided with the first switch cell and the power supply strap provided with the second switch cell.

In addition, the semiconductor integrated circuit device of the above-described aspect may be configured such that, if the arrangement of the plurality of switch cells is represented by a matrix in which rows extending in an X-axis direction correspond to the set of power supply lines and columns extending in a Y-axis direction correspond to the power supply straps, $X+Y \leq M/4$, where X represents a difference in X-coordinates between a first square provided with no switch cell and a second square provided with the switch cell and is closest to the first square, and Y represents a difference in Y-coordinates between the first square and the second square, is satisfied.

According to the present disclosure, the possibility of a power voltage drop can be effectively reduced while reducing the number of switches to be arranged in a semiconductor integrated circuit device to which a power gating technique is applied.

BRIEF DESCRIPTION OF THE DRAWINGS

FIGS. 14A to 14D conceptually illustrate other examples of the switch cell arrangement.

FIGS. 15A to 15C conceptually illustrate other examples of the switch cell arrangement.

DETAILED DESCRIPTION

Embodiments will be described with reference to the drawings.

First Embodiment

Figure 1:
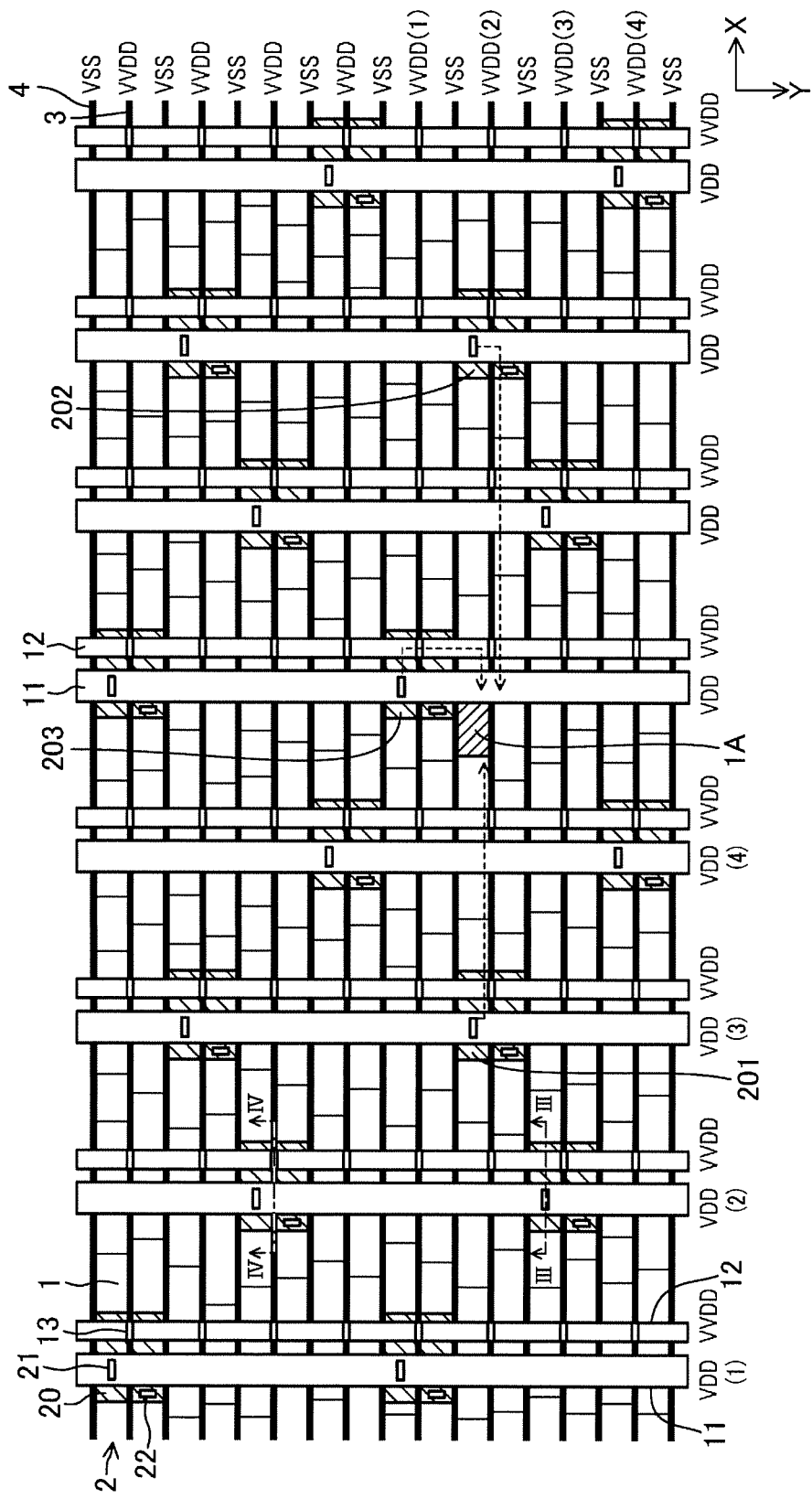
FIG. 1 is a plan view illustrating a configuration of a semiconductor integrated circuit device according to a first embodiment.

FIG. 1 is a plan view illustrating a configuration of a semiconductor integrated circuit device according to a first embodiment. In this drawing, and other plan views to be described later, a layout pattern of a circuit block to which power supply is gated is illustrated in a simplified manner. The semiconductor integrated circuit device shown in FIG. 1 includes a plurality of standard cells 1 arranged on a substrate. Standard cell rows 2, each including a plurality of standard cells 1 arranged in an X-direction (a horizontal direction of the drawing, corresponding to a first direction), are arranged in a Y-direction (a vertical direction of the drawing, corresponding to a second direction perpendicular to the first direction). Each standard cell 1 is a basic circuit element which functions as, for example, an inverter or a logical circuit. A semiconductor integrated circuit device which achieves desired functions can be designed and manufactured by arranging and combining the standard cells 1 via wiring. Each standard cell 1 has an N-type region in which a P-type metal oxide semiconductor (MOS) transistor (PMOS) is formed, and a P-type region in which an N-type MOS transistor (NMOS) is formed. In the present disclosure, the standard cell 1 has the N- and P-type regions arranged side by side in the Y-direction. The arrangement of the N- and P-type regions is reversed between two adjacent standard cell rows 2. The internal structure of the standard cell 1 is not shown in the drawings.

Standard cell power supply lines 3 (with an indication "VVDD" on the right), each of which supplies a power supply potential to the standard cells 1, and ground power supply lines 4 (with an indication "VSS" on the right), each of which supplies a ground potential to the standard cells 1, are alternately arranged in the vertical direction with a single standard cell row 2 interposed between them. The standard cell power supply lines 3 and the ground power supply lines 4 extend in the X-direction. Each standard cell power supply line 3 feeds a power supply potential to the standard cell rows 2 on both sides thereof in the Y-direction. Each ground power supply line 4 feeds a ground potential to the standard cell rows 2 on both sides thereof in the Y-direction. For each of the standard cell power supply lines 3, a switch cell 20 (hatched in the drawing) is provided. The switch cell 20 is able to control power supply/shutting-off to the standard cells 1, and perform switching between electrical connection or disconnection between the standard cell power supply line 3 and a power supply strap 11, which will be described later, in accordance with a control signal. The control signal may be sent from, for example, a control block which controls power gating.

Figure 2:
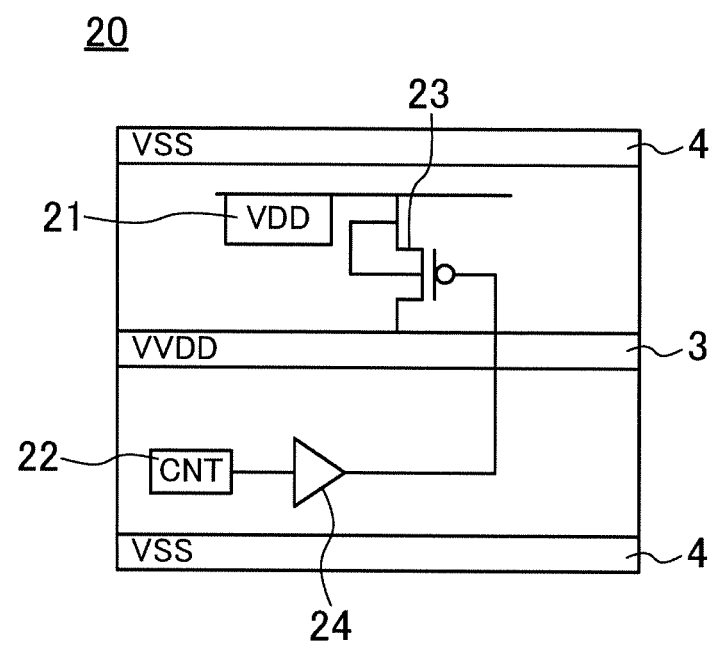
FIG. 2 is a schematic view illustrating a configuration example of a switch cell.

FIG. 2 is a schematic view illustrating a configuration example of the switch cell 20. FIG. 2 illustrates the configuration with circuit symbols. Actually, the configuration includes diffusion regions, gate wiring, and metal wiring arranged as appropriate. The switch cell 20 shown in FIG. 2 is a double-height cell, and includes an input terminal 21 connected to a power supply strap 11, a control terminal 22 which receives a control signal, a PMOS 23, and a buffer 24 which receives the control signal given to the control terminal 22. The PMOS 23 has a source connected to the input terminal 21, a drain connected to the standard cell power supply line 3, and a gate which receives the output of the buffer 24. When the control signal is high, the PMOS 23 is not conducted, and the input terminal 21 and the standard cell power supply line 3 are electrically disconnected. When the control signal is low, the PMOS 23 is conducted, and the input terminal 21 and the standard cell power supply line 3 are electrically connected. Although not shown in FIG. 2, power is supplied to the buffer 24 via the input terminal 21.

Referring back to FIG. 1, the power supply strap 11 is arranged in a layer above the standard cell rows 2 and the standard cell power supply lines 3 to extend in the Y-direction. The power supply strap 11 is connected to the input terminal 21 of the switch cell 20 arranged under the power supply strap 11. Further, a sub-power supply strap 12 is also arranged in a layer above the standard cell rows 2 and the standard cell power supply lines 3 to extend in the Y-direction. The sub-power supply strap 12 is connected to the standard cell power supply lines 3 passing under the sub-power supply strap 12 through via structures 13. In FIG. 1, the power supply strap 11 overlaps with the switch cells 20 when viewed in plan. The sub-power supply strap 12 also overlaps with the switch cells 20 when viewed in plan. In the present specification, the "power supply strap" is a power supply line extending in a direction perpendicular to the standard cell rows 2. Although not shown in FIG. 1, a power supply strap for supplying a ground potential is also arranged in a layer above the standard cell rows 2 and the standard cell power supply lines 3 to extend in the Y-direction.

In FIG. 1, "VDD" indicates lines from the power supply to the switch cells 20, i.e., the power supply straps 11, and "VVDD" indicates lines that go beyond the switch cells 20, i.e., the sub-power supply straps 12 and the standard cell power supply lines 3. The same is applied to the other drawings. Note that when the PMOS 23 of each switch cell 20 is in conduction, the power supply potential is common to the power supply lines "VDD" and "VVDD."

Figure 3:
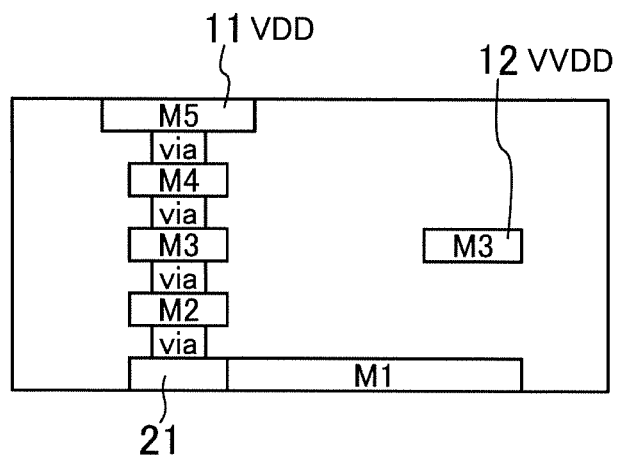
FIG. 3 is a cross-sectional view taken along line III-III of FIG. 1.
Figure 4:
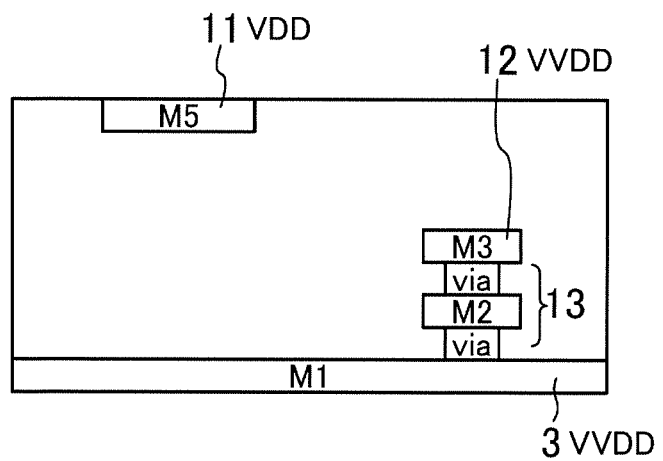
FIG. 4 is a cross-sectional view taken along line IV-IV of FIG. 1.

FIG. 3 is a cross-sectional view taken along line III-III of FIG. 1, and FIG. 4 is a cross-sectional view taken along line IV-IV of FIG. 1, both of which illustrate a region provided with the switch cell 20 in cross section. The semiconductor integrated circuit device of FIG. 1 has five or more wiring layers on the substrate. As shown in FIGS. 3 and 4, first to fifth wiring layers (M1 to M5) are stacked in this order on the substrate. The power supply strap 11 is formed in the fifth wiring layer (M5), and the sub-power supply strap 12 in the third wiring layer (M3). That is, the sub-power supply strap 12 is formed in a layer below the power supply strap 11. The standard cell power supply lines 3 are formed in the first wiring layer (M1). Although not shown, the ground supply lines 4 are also formed in the first wiring layer, and signal lines of the standard cells 1 are mainly formed in the first wiring layer. In FIG. 1, the first, second, and fourth wiring layers are preferentially routed in the X-direction, while the third and fifth wiring layers in the Y-direction.

The positions of the switch cells 20 in the configuration of FIG. 1 will be described below. Each switch cell 20 is provided between the power supply strap 11 and the standard cell power supply line 3 at an intersection of the power supply strap 11 and the standard cell power supply line 3 when viewed in plan. Note that the switch cells 20 are not arranged at some of the intersections of the power supply straps 11 and the standard cell power supply lines 3.

In the configuration of FIG. 1, in each of the power supply straps 11, the switch cell 20 is arranged in every four standard cell power supply lines 3. In other words, in each of the power supply straps 11, three standard cell power supply lines 3 exist between the switch cells 20 that are adjacent to each other in the Y-direction. Further, the switch cells 20 in the power supply straps 11 adjacent to each other are arranged at different positions in the Y-direction. In addition, the positions of the switch cells 20 are arranged at the same position in the Y-direction every four power supply straps 11.

For example, four standard cell power supply lines 3 (with indications (1) to (4)) on the lower side of FIG. 1 and four power supply straps 11 (with indications (1) to (4)) on the left side of FIG. 1 will be discussed below. For the power supply strap 11(1), the switch cell 20 is arranged only between the power supply strap 11(1) and the standard cell power supply line 3(1), while no switch cell 20 is arranged between the power supply strap 11(1) and other standard cell power supply lines 3(2) to 3(4). Likewise, the power supply strap 11(2) is provided with the switch cell 20 arranged only between the power supply strap 11(2) and the standard cell power supply line 3(3); the power supply strap 11(3) is provided with the switch cell 20 arranged only between the power supply strap 11(3) and the standard cell power supply line 3(2); and the power supply strap 11(4) is provided with the switch cell 20 arranged only between the power supply strap 11(4) and the standard cell power supply line 3(4).

More specifically, the four power supply straps 11(1) to 11(4) are provided with the switch cells 20 arranged at positions between the power supply straps 11(1) to 11(4) and the standard cell power supply lines 3(1), 3(3), 3(2), and 3(4) in this order. Such arrangement of the switch cells 20 is repeated in the X-direction and the Y-direction.

Now, a standard cell 1A (hatched in the drawing) will be discussed below. In FIG. 1, broken lines with arrows are provided for some of paths supplying power to the standard cell 1A. The standard cell 1A, which is connected to the standard cell power supply line 3(2), is distant from switch cells 201, 202 provided for the standard cell power supply line 3(2). Thus, there is a concern over a power supply voltage drop. On the other hand, in the standard cell power supply line 3(1) that is next to the standard cell power supply line 3(2), a switch cell 203 is arranged near the standard cell 1A. Thus, power is supplied to the standard cell 1A from the switch cell 203 through the sub-power supply strap 12, which can reduce the possibility of the power supply voltage drop. More specifically, the switch cell 201 as a first switch cell and the switch cell 202 as a second switch cell are provided for the standard cell power supply line 3(2), and are adjacent to each other in the X-direction. The switch cell 203 as a third switch cell is provided for the standard cell power supply line 3(1) that is next to the standard cell power supply line 3(2) in the Y-direction. Further, the switch cell 203 is provided for the power supply strap 11 at a midpoint position between the power supply strap 11 provided with the switch cell 201 and the power supply strap 11 provided with the switch cell 202.

In this manner, in the configuration of FIG. 1, even in a case where the standard cell 1 is distant from the switch cell 20 provided for the standard cell power supply line 3 to which it is connected, another switch cell 20 provided for the adjacent standard cell power supply lines 3 is arranged in the vicinity thereof. For example, for the standard cell 1 that is at the midpoint position between the switch cells 20 adjacent to each other in the X-direction, another switch cell 20 is arranged adjacent to the standard cell 1 in the Y-direction. Thus, power is supplied from the switch cell 20 through the sub-power supply strap 12, which can reduce the possibility of the power supply voltage drop. Therefore, according to the present embodiment, the possibility of the power supply voltage drop can be reduced in each of the standard cells 1 while reducing the number of the switch cells 20.

In the configuration shown in FIG. 1, each of the sub-power supply straps 12 is arranged adjacent to an associated one of the power supply straps 11. However, this configuration is not limiting. For example, each of the sub-power supply straps 12 may be spaced apart from an associated one of the power supply straps 11 so that the sub-power supply straps 12 do not overlap with the switch cells 20 when viewed in plan. Alternatively, some of the sub-power supply straps 12 may be arranged apart from associated ones of the power supply straps 11.

In the configuration shown in FIG. 1, the switch cells 20 are arranged below the power supply straps 11, and overlap with the power supply straps 11 when viewed in plan. However, this configuration is not limiting. If the switch cells 20 are arranged below the power supply straps 11, a value of resistance of a path between the input terminal 21 of each switch cell 20 and the power supply strap 11, such as wiring and via structures, decreases. This can reduce drop of the power supply voltage. In the configuration shown in FIG. 1, the sub-power supply straps 12 overlap with the switch cells 20 when viewed in plan. However, this configuration is not limiting.

In the configuration shown in FIG. 1, each sub-power supply strap 12 is electrically connected to the standard cell power supply lines 3 passing under the sub-power supply strap 12. However, this configuration is not limiting. For example, the sub-power supply strap 12 may be connected to only some of the standard cell power supply lines 3 passing under the sub-power supply strap 12.

First Alternative Example

In the configuration of FIG. 1, the four power supply straps 11(1) to 11(4) are provided with the switch cells 20 arranged at positions between the power supply straps 11(1) to 11(4) and the standard cell power supply lines 3(1), 3(3), 3(2), and 3(4) in this order. However, the arrangement pattern of the switch cells 20 is not limited to that illustrated in FIG. 1.

Figure 5:
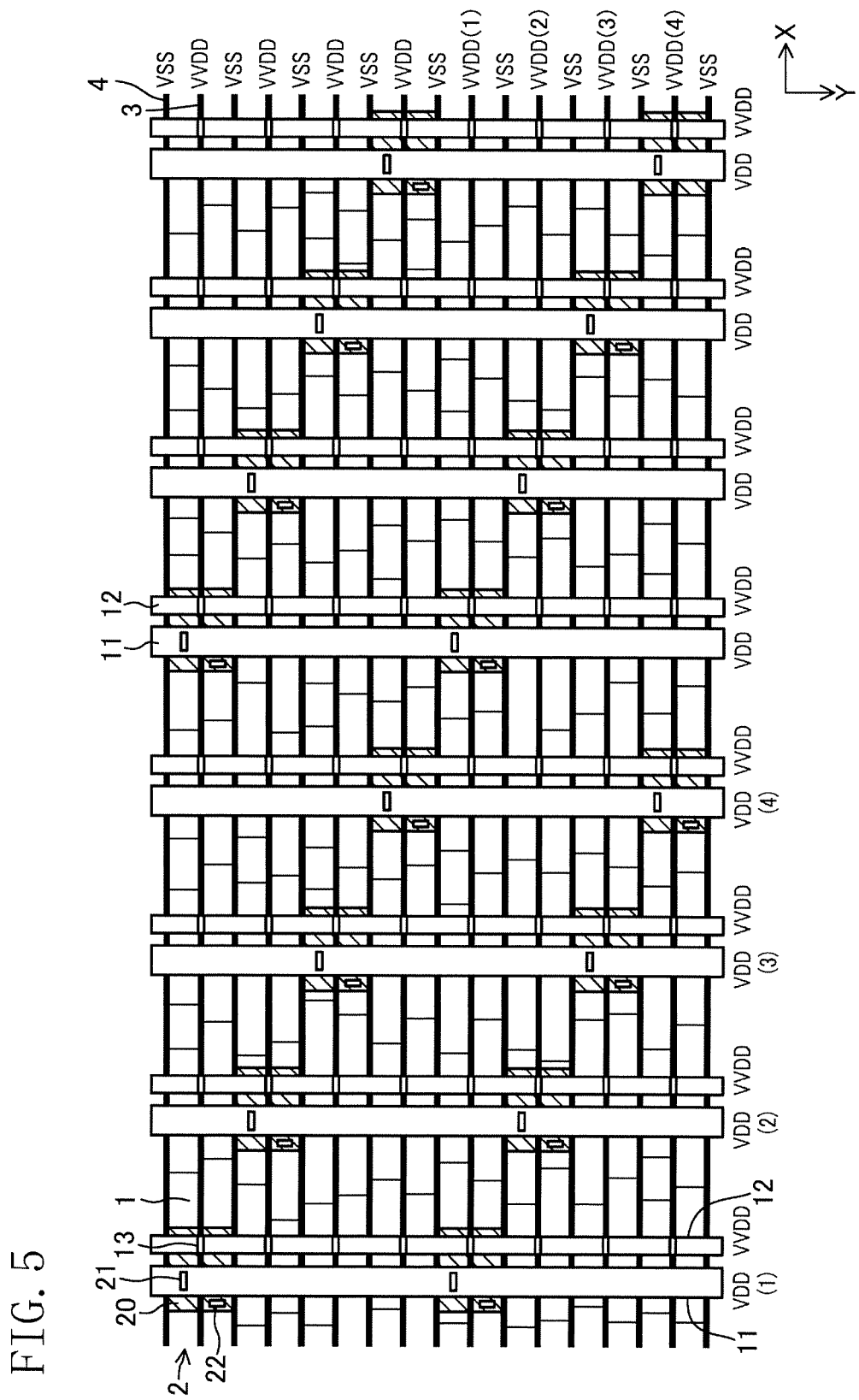
FIG. 5 is a plan view illustrating a configuration of a semiconductor integrated circuit device according to an alternative example of the first embodiment.

FIG. 5 is a plan view illustrating a configuration of a semiconductor integrated circuit device according to a first alternative example of the present embodiment. The standard cells 1, the standard cell power supply lines 3, the ground power supply lines 4, the power supply straps 11, and the sub-power supply straps 12 are arranged in the same manner as those shown in FIG. 1, and their detailed description is omitted.

In the configuration of FIG. 5, just like that of FIG. 1, each of the power supply straps 11 is provided with the switch cell 20 arranged every four standard cell power supply lines 3. Furthermore, the switch cells 20 in the power supply straps 11 adjacent to each other are arranged at different positions in the Y-direction. In addition, the switch cells 20 are arranged at the same position in the Y-direction every four power supply straps 11.

However, in the configuration of FIG. 5, the arrangement pattern of the switch cells 20 is different from that in the configuration of FIG. 1. More specifically, for the power supply strap 11(1), the switch cell 20 is arranged only between the power supply strap 11(1) and the standard cell power supply line 3(1), while no switch cell 20 is arranged between the power supply strap 11(1) and other standard cell power supply lines 3(2) to 3(4). Likewise, the power supply strap 11(2) is provided with the switch cell 20 arranged only between the power supply strap 11(2) and the standard cell power supply line 3(2); the power supply strap 11(3) is provided with the switch cell 20 arranged only between the power supply strap 11(3) and the standard cell power supply line 3(3); and the power supply strap 11(4) is provided with the switch cell 20 arranged only between the power supply strap 11(4) and the standard cell power supply line 3(4). More specifically, the four power supply straps 11(1) to 11(4) are provided with the switch cells 20 arranged at positions between the power supply straps 11(1) to 11(4) and the standard cell power supply lines 3(1), (2), (3), and (4) in this order. Such arrangement of the switch cell 20 is repeated in the X-direction and the Y-direction.

Also in the configuration of FIG. 5, even in a case where the standard cell 1 is distant from the switch cell 20 provided for the standard cell power supply line 3 to which it is connected, another switch cell 20 provided for the adjacent standard cell power supply lines 3 is arranged in the vicinity thereof. Thus, power is supplied from the switch cell 20 through the sub-power supply strap 12, which can reduce the possibility of the power supply voltage drop. Therefore, the possibility of the power voltage drop can be reduced in each of the standard cells 1 while reducing the number of the switch cells 20.

Second Alternative Example

Figure 6:
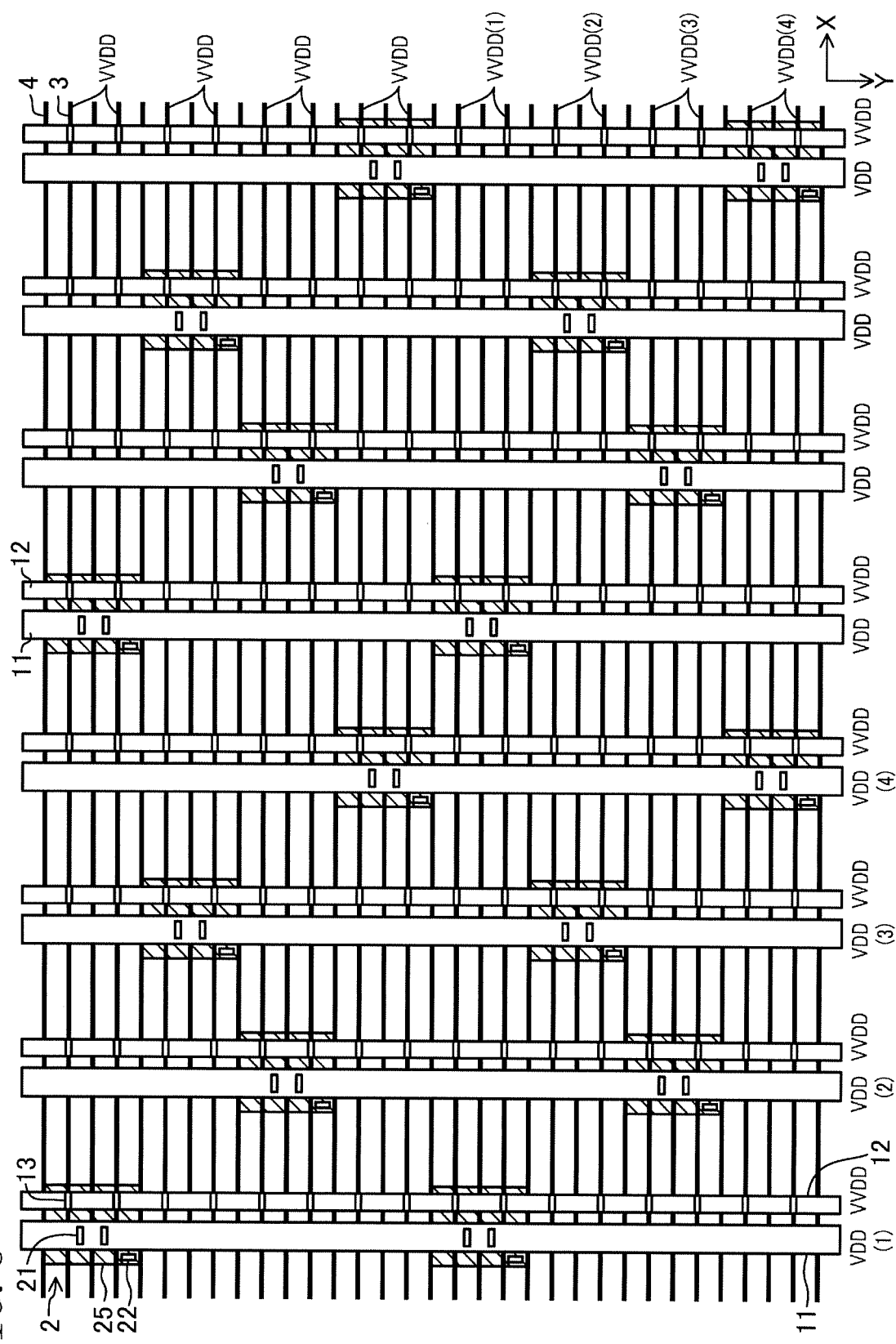
FIG. 6 is a plan view illustrating a configuration of a semiconductor integrated circuit device according to an alternative example of the first embodiment.

FIG. 6 is a plan view illustrating a configuration of a semiconductor integrated circuit device according to a second alternative example of the present embodiment. In FIG. 6, the standard cells 1 are not shown for simplification of the drawing. The standard cell power supply lines 3, the ground power supply lines 4, the power supply straps 11, and the sub-power supply straps 12 are arranged almost in the same manner as those in FIG. 1, and their detailed description is omitted.

In the configuration of FIG. 6, switch cells 25 respectively have a size in the Y-direction (cell height) which is double the size of the switch cell 20 in FIG. 1, and is equivalent to the cell height of four standard cell rows 2. Further, each switch cell 25 is provided between the power supply strap 11 and two standard cell power supply lines 3. More specifically, when the two standard cell power supply lines 3 are regarded as one "set of lines," each switch cell 25 is provided between the power supply strap 11 and the set of lines. In the configuration of FIG. 6, each of the power supply straps 11 is provided with the switch cell 25 arranged every four sets of lines. Moreover, the switch cells 25 in the power supply straps 11 adjacent to each other are arranged at different positions in the Y-direction. In addition, the switch cells 25 are arranged at the same position in the Y-direction every four power supply straps 11.

For example, four power supply straps 11 (with indications (1) to (4)) on the left side of FIG. 6 and four sets of lines (1) to (4) on the lower side of FIG. 6 will be discussed below. For the power supply strap 11(1), the switch cell 25 is arranged only between the power supply strap 11(1) and the set of lines (1), while no switch cell 25 is arranged between the power supply strap 11(1) and other sets of lines (2) to (4). Likewise, the power supply strap 11(2) is provided with the switch cell 25 arranged only between the power supply strap 11(2) and the set of lines (3); the power supply strap 11(3) is provided with the switch cell 25 arranged only between the power supply strap 11(3) and the set of lines (2); and the power supply strap 11(4) is provided with the switch cell 25 arranged only between the power supply strap 11(4) and the set of lines (4). More specifically, the four power supply straps 11(1) to 11(4) are provided with the switch cells 25 arranged at positions between the power supply straps 11(1) to 11(3) and the sets of lines (1), (3), (2), and (4) in this order. Such arrangement of the switch cells 25 is repeated in the X-direction and the Y-direction.

Specifically, in the configuration of FIG. 6, the switch cells 25 are arranged in the same manner as the switch cells 20 in FIG. 1. Therefore, the possibility of the power voltage drop can be reduced in each of the standard cells 1 while reducing the number of the switch cells 25.

Note that the arrangement pattern of the switch cells 25 is not limited to that illustrated in FIG. 1. For example, like the configuration in FIG. 5, the four power supply straps 11(1) to 11(4) may be provided with the switch cells 25 arranged between the power supply straps 11(1) to 11(4) and the sets of lines (1), (2), (3), and (4) in this order.

Third Alternative Example

Figure 7:
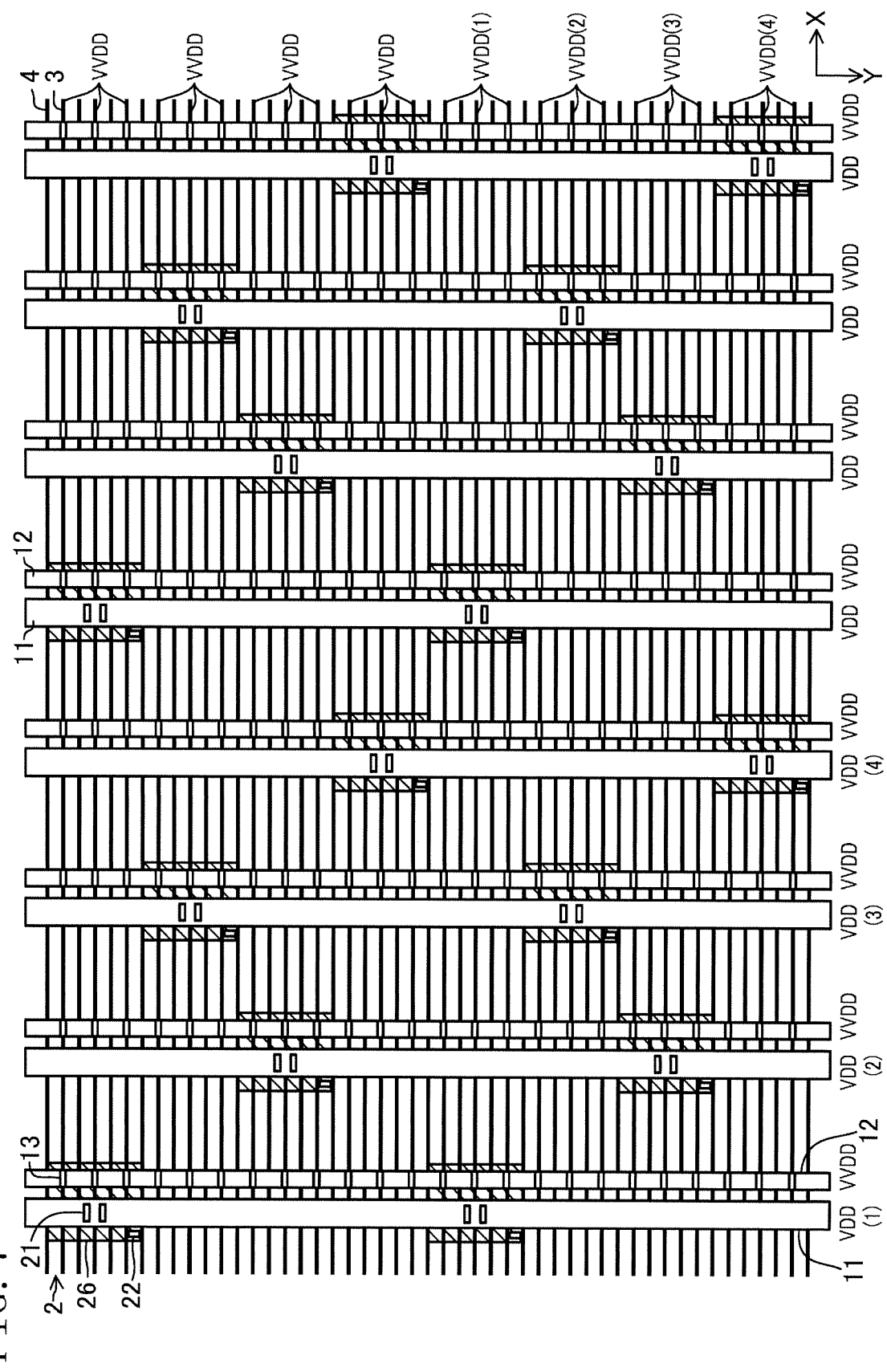
FIG. 7 is a plan view illustrating a configuration of a semiconductor integrated circuit device according to an alternative example of the first embodiment.

FIG. 7 is a plan view illustrating a configuration of a semiconductor integrated circuit device according to a third alternative example of the present embodiment. In FIG. 7, the standard cells 1 are not shown for simplification of the drawing. The standard cell power supply lines 3, the ground power supply lines 4, the power supply straps 11, and the sub-power supply straps 12 are arranged almost the same manner as those in FIG. 1, and their detailed description is omitted.

In the configuration of FIG. 7, switch cells 26 respectively have a size in the Y-direction (cell height) which is triple the size of the switch cell 20 in FIG. 1, and is equivalent to the cell height of six standard cell rows 2. Further, each switch cell 26 is provided between the power supply strap 11 and three standard cell power supply lines 3. More specifically, when the three standard cell power supply lines 3 are regarded as one "set of lines," each switch cell 26 is provided between the power supply straps 11 and the set of lines.

In the configuration of FIG. 7, just like in the configuration in FIG. 6, each of the power supply straps 11 is provided with the switch cell 26 arranged every four sets of lines. Moreover, the switch cells 26 in the power supply straps 11 adjacent to each other are arranged at different positions in the Y-direction. In addition, the switch cells 26 are arranged at the same position in the Y-direction every four power supply straps 11.

For example, four power supply straps 11 (with indications (1) to (4)) on the left side of FIG. 7 and four sets of lines (1) to (4) on the lower side of FIG. 7 will be discussed below. For the power supply strap 11(1), the switch cell 26 is arranged only between the power supply strap 11(1) and the set of lines (1), while no switch cell 26 is arranged between the power supply strap 11(1) and other sets of lines (2) to (4). Likewise, the power supply strap 11(2) is provided with the switch cell 26 arranged only between the power supply strap 11(2) and the set of lines (3); the power supply strap 11(3) is provided with the switch cell 26 arranged only between the power supply strap 11(3) and the set of lines (2); and the power supply strap 11(4) is provided with the switch cell 26 arranged only between the power supply strap 11(4) and the set of lines (4). More specifically, the four power supply straps 11(1) to 11(4) are provided with the switch cells 26 arranged at positions between the power supply straps 11(1) to 11(4) and the sets of lines (1), (3), (2), and (4) in this order. Such arrangement of the switch cells 26 is repeated in the X-direction and the Y-direction.

Specifically, in the configuration of FIG. 7, the switch cells 26 are arranged in the same manner as in the configuration in FIG. 1. Therefore, the possibility of power voltage drop can be reduced in each of the standard cells 1 while reducing the number of the switch cells 26.

Note that the arrangement pattern of the switch cells 26 is not limited to that illustrated in FIG. 7. For example, like the configuration in FIG. 5, the four power supply straps 11(1) to 11(4) may be provided with the switch cells 26 arranged between the power supply straps 11(1) to 11(4) and the sets of lines (1), (2), (3), and (4) in this order.

In this embodiment, two standard cell power supply lines 3 are regarded as one "set of lines" in the second alternative example, and three standard cell power supply lines 3 are regarded as one "set of lines" in the third alternative example. However, the number of standard cell power supply lines 3 belonging to the set of lines is not limited to two or three. For example, four standard cell power supply lines 3 may be regarded as one "set of lines," and a switch cell having a cell height equivalent to the height of eight standard cell rows 2 may be arranged in the same manner as in the present embodiment. In addition, the configurations in FIG. 1 and FIG. 5 correspond to those in which a single standard cell power supply line 3 is regarded as one "set of lines." That is, the switch cells may be arranged with N standard cell power supply lines 3 (N is an integer of 1 or more) regarded as one set of lines.

Second Embodiment

Figure 8:
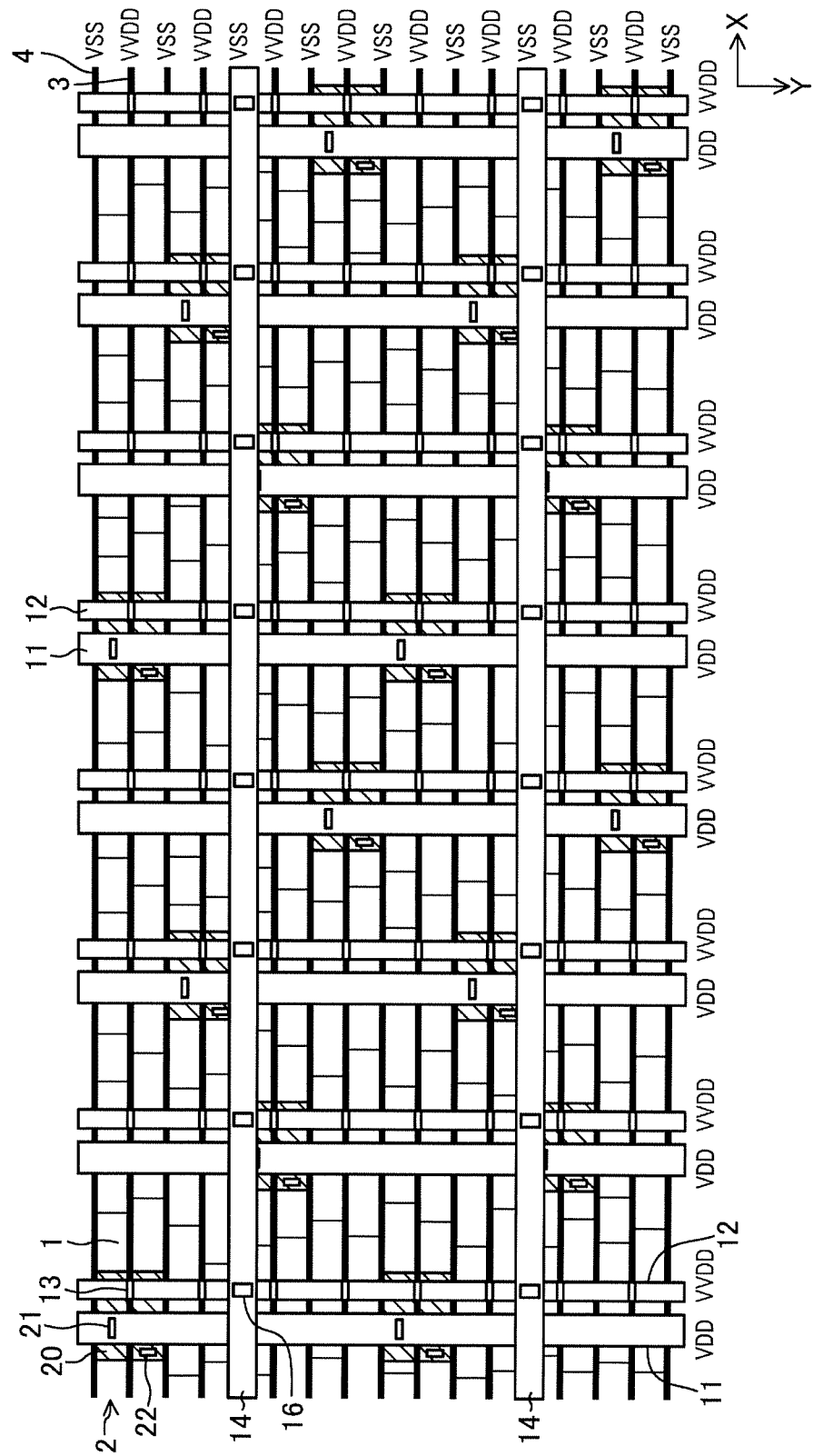
FIG. 8 is a plan view illustrating a configuration of a semiconductor integrated circuit device according to a second embodiment.

FIG. 8 is a plan view illustrating a configuration of a semiconductor integrated circuit device according to a second embodiment. The standard cells 1, the standard cell power supply lines 3, the ground power supply lines 4, the power supply straps 11, and the sub-power supply straps 12 are arranged in the same manner as those in FIG. 1, and their detailed description is omitted.

Compared to the configuration of FIG. 1, upper power supply lines 14 extending in the X-direction are arranged in a layer above the power supply straps 11 and the sub-power supply straps 12 in the configuration of FIG. 8. The layer power supply lines 14 are connected to the sub-power supply straps 12 formed in a lower layer thereof through a via 16. In this manner, providing the upper power supply lines 14 that connect the sub-power supply straps 12 with one another can enhance power supply, which can reduce the possibility of the power supply voltage drop.

In the configuration of FIG. 8, the upper power supply lines 14 are electrically connected to all the sub-power supply straps 12 passing underneath thereof, but the present disclosure is not limited thereto. For example, the upper power supply lines 14 may be electrically connected to only some of the sub-power supply straps 12 passing underneath thereof.

Third Embodiment

Figure 9:
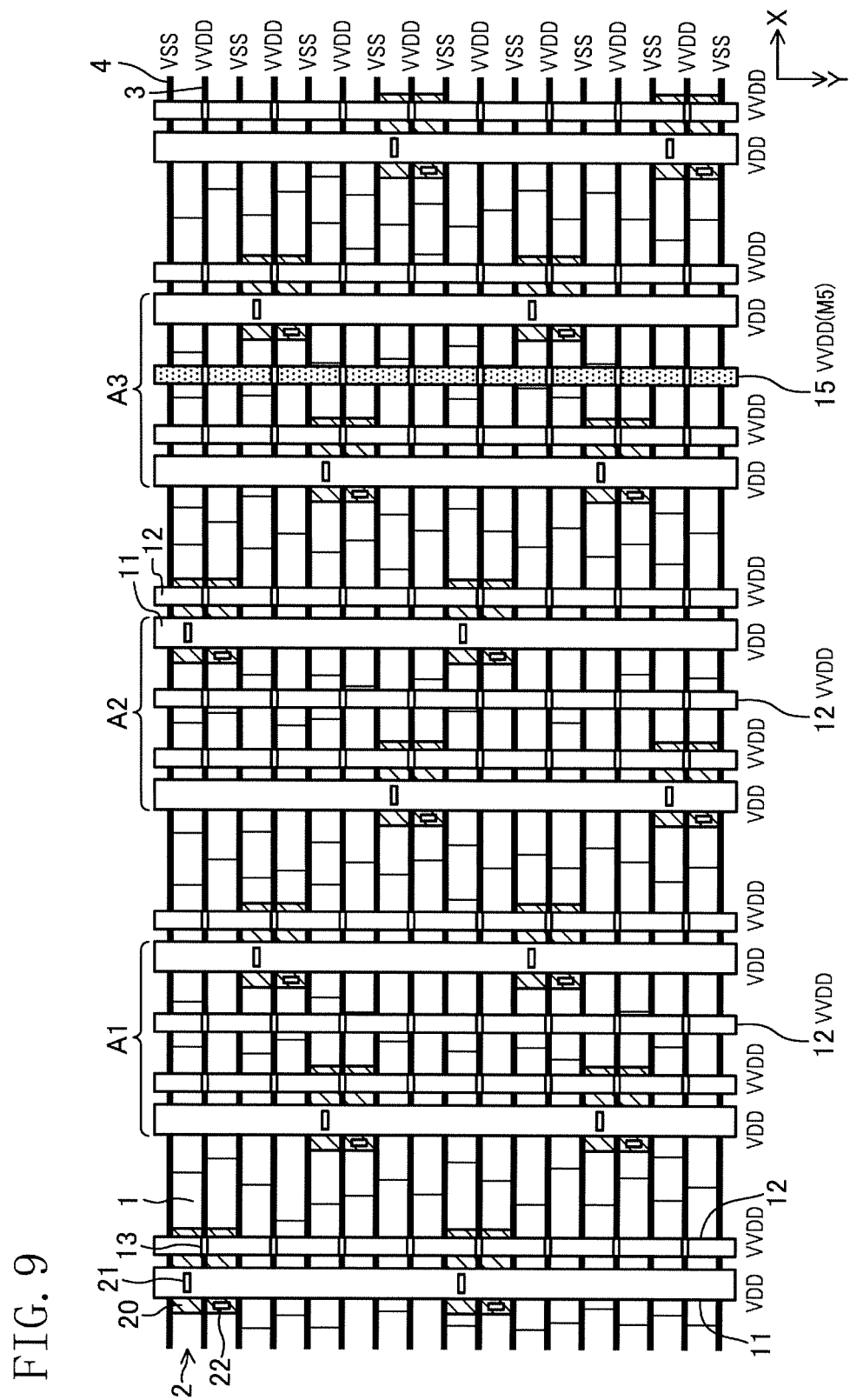
FIG. 9 is a plan view illustrating a configuration of a semiconductor integrated circuit device according to a third embodiment.

FIG. 9 is a plan view illustrating a configuration of a semiconductor integrated circuit device according to a third embodiment. The standard cells 1, the standard cell power supply lines 3, the ground power supply lines 4, and the power supply straps 11 are arranged in the same manner as those in FIG. 1, and their detailed description is omitted.

Compared to the configuration of FIG. 1, the configuration of FIG. 9 includes a larger number of sub-power supply straps. For example, two sub-power supply straps 12 are arranged between the power supply straps 11 in regions A1 and A2. In addition to the sub-power supply straps 12, another sub-power supply strap 15 that is formed in a wiring layer (in this example, the fifth wiring layer (M5)) that is different from the sub-power supply straps 12 is arranged between the power supply straps 11 in a region A3. It should be noted that three or more sub-power supply straps 12, 15 may be arranged between the power supply straps 11.

As can be seen, increasing the number of sub-power supply straps 12 and 15 can enhance the power supply without increasing the number of switch cells 20. Thus, the area of the semiconductor integrated circuit device does not significantly increase.

Fourth Embodiment

Figure 10:
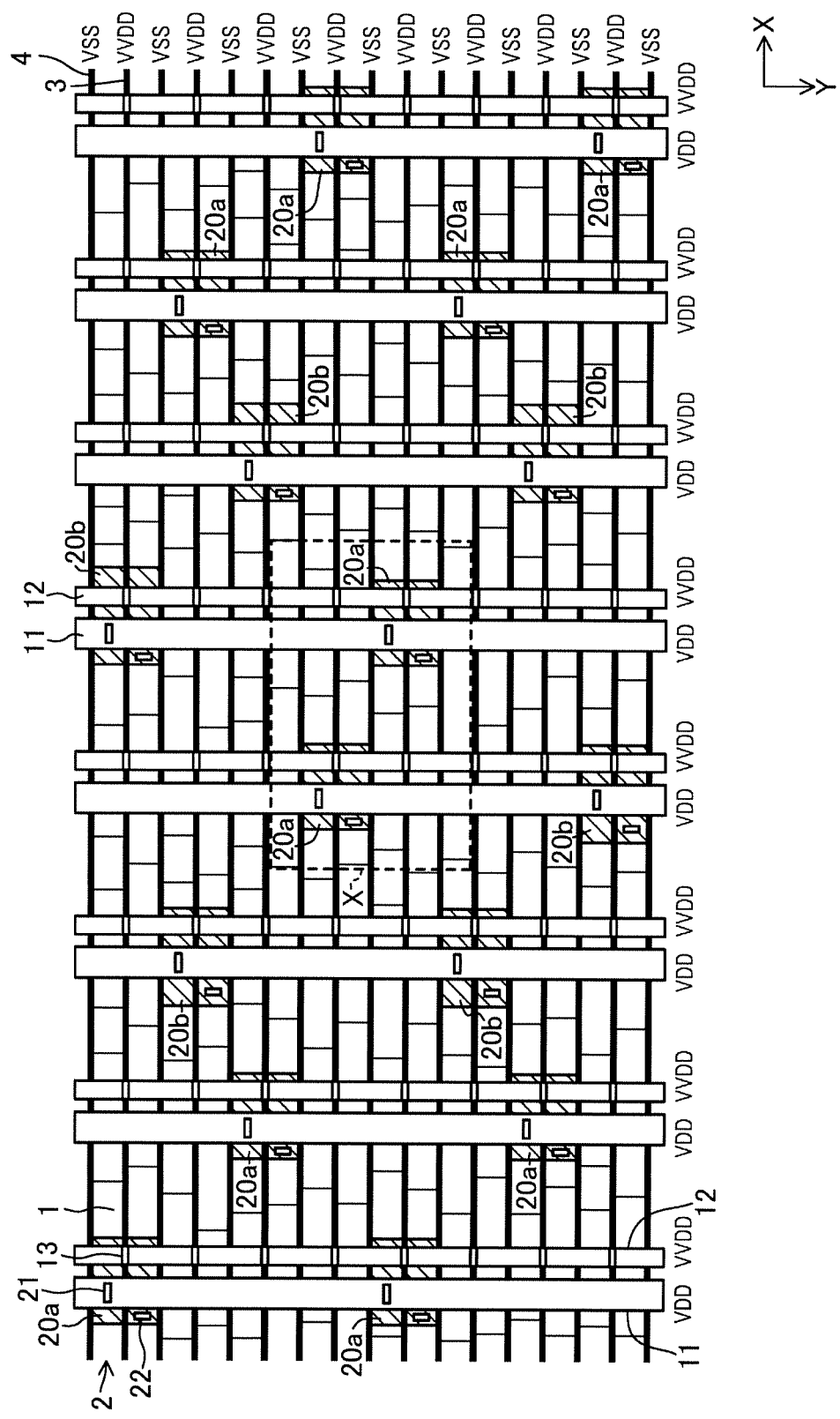
FIG. 10 is a plan view illustrating a configuration of a semiconductor integrated circuit device according to a fourth embodiment.

FIG. 10 is a plan view illustrating a configuration of a semiconductor integrated circuit device according to a fourth embodiment. In the fourth embodiment, the standard cells 1, the standard cell power supply lines 3, the ground power supply lines 4, the power supply straps 11, and the sub-power supply straps 12 are arranged substantially in the same manner as shown in FIG. 1, and their detailed description is omitted.

The configuration of FIG. 10 includes switch cells 20*a* having standard drivability and switch cells 20*b* having improved drivability. The switch cells 20a and 20b have different transistor sizes. A region X defined by a dotted rectangle is a region which requires enhanced power supply. The region X is occupied by the standard cells 1 arranged at high density, and thus, the switch cells 20a cannot be added any more in the region X. Therefore, the switch cells 20b with further improved drivability than the switch cells 20a are arranged around the region X. This configuration allows the region X to receive power from the switch cells 20b with improved drivability via the sub-power supply straps 12.

(Arrangement Pattern and Arrangement Method of Switch Cell)

Figure 11:
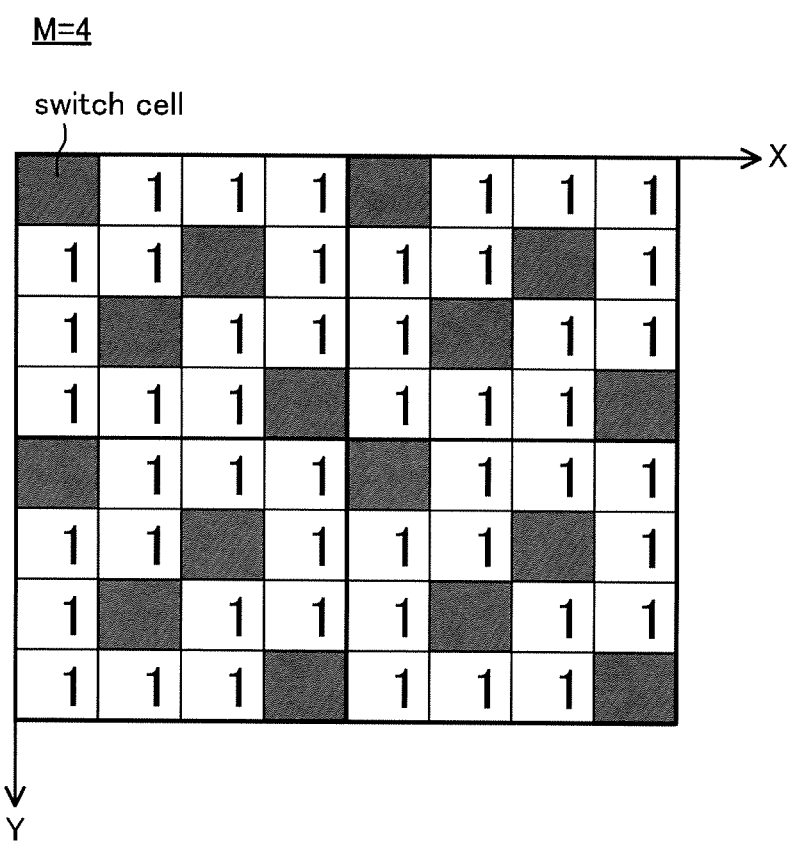
FIG. 11 is a conceptual diagram illustrating how switch cells are arranged in the configuration of FIG. 1.

FIG. 11 is a conceptual diagram illustrating how the switch cells 20 are arranged in the configuration of FIG. 1. In FIG. 11, rows extending in the X-axis direction correspond to the standard cell power supply lines 3, and columns extending in the Y-axis direction correspond to the power supply straps 11. Squares correspond to intersections of the standard cell power supply lines 3 and the power supply straps 11 when viewed in plan. In other words, the squares correspond to positions where the switch cells 20 can be arranged. Moreover, gray squares represent positions where the switch cells 20 are arranged, and white squares represent positions with no switch cell 20. It should be noted that, in a case where the switch cells 25, 26 having higher cell heights than the switch cells 20 are arranged for a plurality of standard cell power supply lines 3 as in the configurations of FIGS. 6 and 7, each of the rows extending in the X-axis direction in FIG. 11 correspond to the "set of lines" including the plurality of standard cell power supply lines 3.

In FIG. 11, each white square is marked with a numeral representing a distance to a gray square that is closest to the square. Specifically, a minimum value of the sum of a difference in X coordinates between the white square and the gray square and a difference in Y coordinates between the white square and the gray square is shown. In FIG. 11, all the white squares have a numeral "1." This means that the switch cell is arranged in any of the left, right, top, and bottom of every position with no switch cell.

Figure 12:
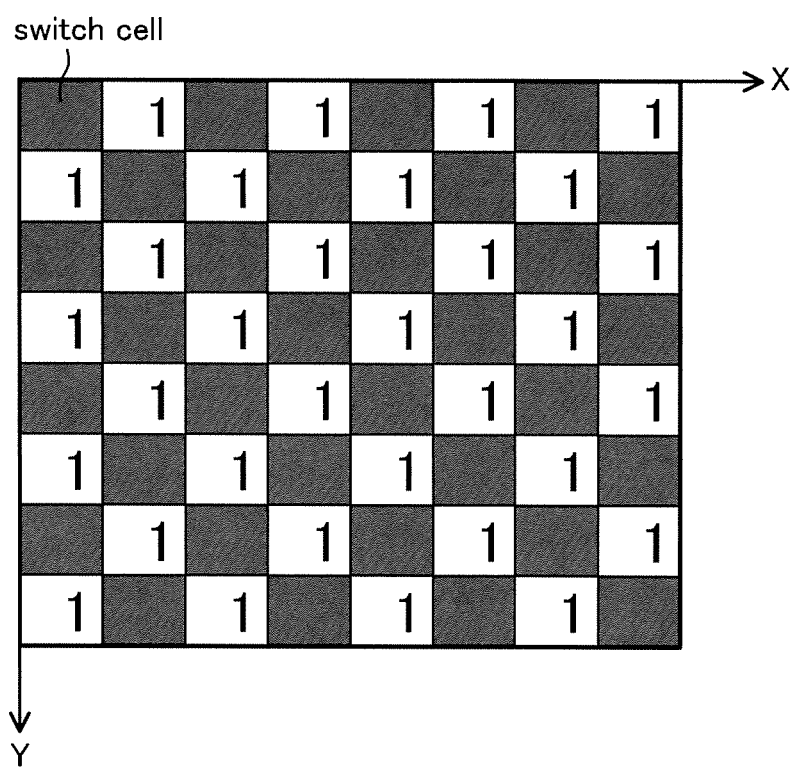
FIG. 12 is a comparative conceptual diagram how the switch cells are arranged.

FIG. 12 is a comparative conceptual diagram illustrating how the switch cells are arranged. In FIG. 12, the switch cells are arranged in a staggered pattern. As can be seen from FIG. 12, also in the staggered pattern, all the white squares have a numeral "1," i.e., the switch cell is arranged in any of the left, right, top, and bottom of every position with no switch cell. This can reduce the possibility of the power supply voltage drop. However, as can be understood from the comparison with FIG. 11, the number of the switch cells required is double the number of the switch cells in the above embodiment, i.e., a great number of switch cells are required. Specifically, according to the present embodiment, the possibility of the power supply voltage drop can be reduced in each of the standard cells 1 while reducing the number of switch cells.

It should be noted that, in the above embodiment, the arrangement patterns of the switch cells 20, 25, and 26 are set while four power supply straps 11 and four standard cell power supply lines 3 or four sets of lines are regarded as a unit. However, the present disclosure is not limited thereto. More specifically, the arrangement patterns of the switch cells 20, 25, and 26 can be set with M power supply straps 11 and M standard cell power supply lines 3 or M sets of lines regarded as a unit (M is an integer of 3 or more).

Figure 13:
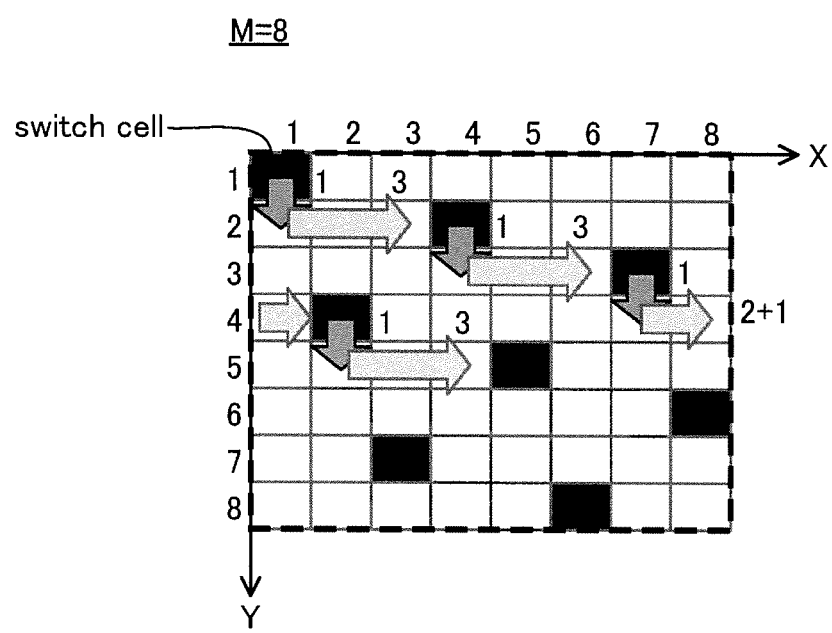
FIG. 13 is a view illustrating a method for arranging the switch cells.

In this case, the arrangement pattern of the switch cells can be set in the following manner, for example. With reference to FIG. 13, a case where M is 8 will be described as an example. First, a matrix of M squares×M squares is created. In the matrix, rows extending in the X-axis direction correspond to the standard cell power supply lines 3 or the sets of lines including a plurality of standard cell power supply lines 3, and columns extending in the Y-axis direction correspond to the power supply straps 11. To begin with, a switch cell is arranged in the top left square (coordinates: 1, 1) Then, after moving to the square immediately below it, a shift is made to the mx$^{th}$ square on the right (mx=3 in FIG. 13), in which a switch cell is arranged. This operation is repeatedly performed. As a result, an arrangement pattern as illustrated in FIG. 13 can be obtained.

Figures 14A, 14B, 14C, 14D:
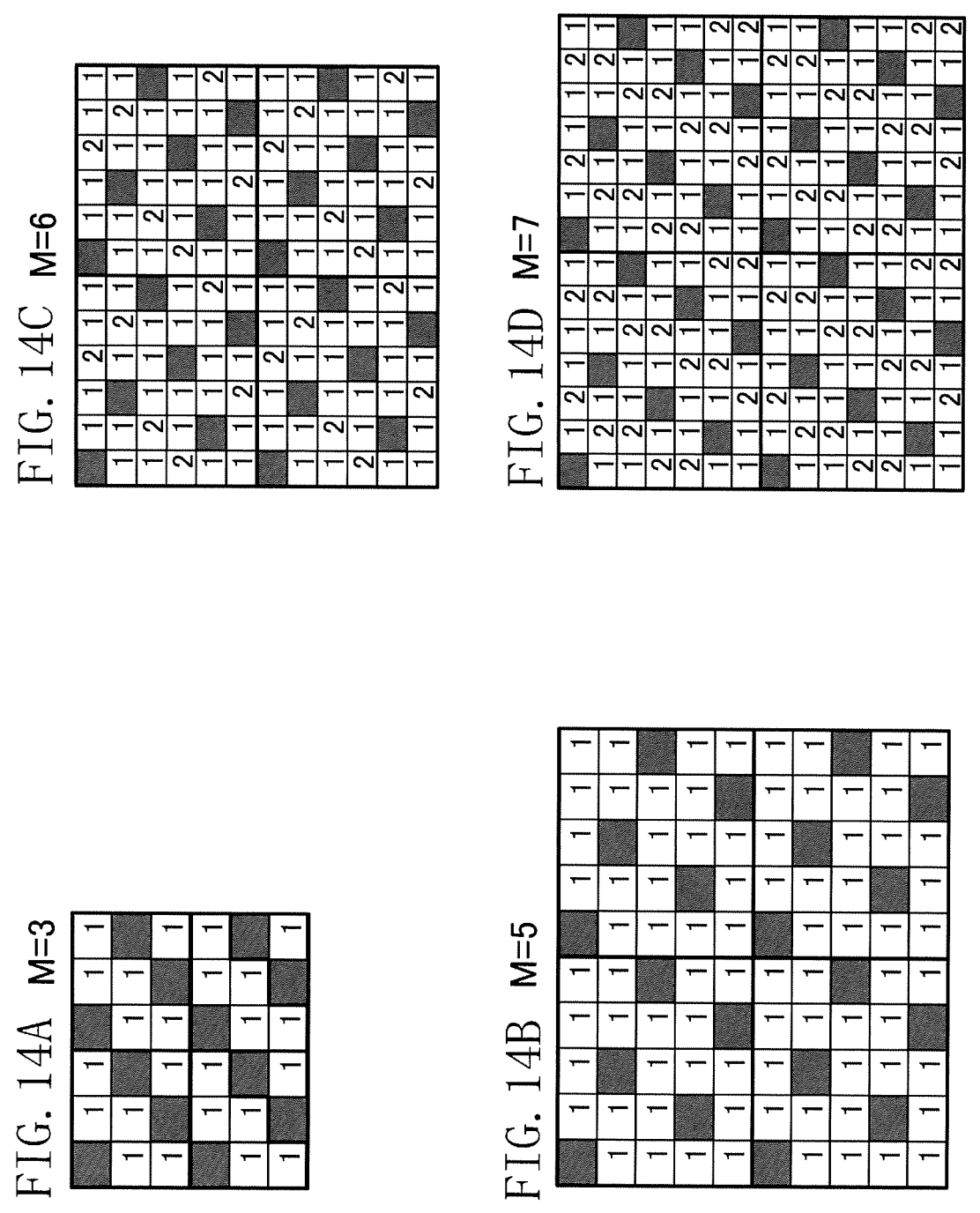

FIGS. 14A to 14D and FIGS. 15A to 15C show arrangement patterns of the switch cells obtained by the above-described method. FIG. 14A shows the case where M=3; FIG. 14B the case where M=5; FIG. 14C the case where M=6; and FIG. 14D the case where M=7. FIG. 15A shows the case where M=8; FIG. 15B the case where M=12; and FIG. 15C the case where M=16. In the same manner as in FIG. 11, gray squares correspond to positions where the switch cells are arranged, and white squares with numerals representing the distance to a gray square closest to the squares (i.e., the closest switch cell).

The relations between values M and values of movement mx are as follows.

M=3: mx=2
M=4: mx=in order of 2, 3, 2
M=5: mx=2
M=6: mx=in order of 2, 3, 4, 4, 3, 2
M=7: mx=3
M=8: mx=3
M=12: mx=5
M=16: mx=5

If the maximum value of numerals in the white squares is regarded as Dmax, the relations will be as follows.

M=3: Dmax=1
M=4: Dmax=1
M=5: Dmax=1
M=6: Dmax=2
M=7: Dmax=2
M=8: Dmax=2
M=12: Dmax=3
M=16: Dmax=4

In this example, if M=4, 5, 8, 12, or 16, the following relation is established.

$$D\max \leq M/4$$

If the arrangement patterns of the switch cells illustrated in FIGS. 14A to 14D and FIGS. 15A to 15C are applied to the semiconductor integrated circuit device, the possibility of the power voltage drop can be reduced more effectively with a smaller number of switch cells.

Other Embodiments

It has been described above that the power supply straps 11 are formed in the fifth wiring layer, and the sub-power supply straps 12 and 15 are formed in the third and fifth wiring layers. However, this is not limiting, and the power supply straps and the sub-power supply straps may be formed in other wiring layers. In one preferred embodiment, the sub-power supply straps are formed in the wiring layer which is as close as possible to the standard cell power supply lines. In so doing, the value of resistance of paths between the sub-power supply straps and the standard cell power supply lines, such as wiring and via structures, decreases. This can reduce drop of the power supply potential. Further, it has been described above that the standard cell power supply lines 3 are formed in the first wiring layer. However, this is not limiting, and the standard cell power supply lines 3 may be formed in two or more wiring layers, for example.

The configuration of the switch cell 20 shown in FIG. 2 is merely an example. The switch cell 20 may be configured in any way as long as it is capable of switching between electrical connection and disconnection between the standard cell power supply line 3 and the power supply strap 11 in accordance with a control signal. For example, the buffer 24 shown in FIG. 2 may be replaced with an inverter. In such a case, relationship between the logic of the control signal and connection/disconnection is reversed. Alternatively, two sets of the circuit configuration shown in FIG. 2 may be provided. The switch cell 20 shown in FIG. 2 is a double-height cell, which may be replaced with a single-height cell.

It has been described above that the switch cell 20 is provided for the standard cell power supply line 3 which supplies a power supply potential to the standard cells 1. As an alternative to this configuration, the switch cell may be provided for the ground power supply line 4 which supplies a ground potential in the same configuration as described above. In such a case, the sub-power supply strap may be provided to connect the ground power supply lines 4.

The present disclosure can achieve enhanced power supply in a semiconductor integrated circuit device using a power gating technique, without increasing the number of switch cells, and thus, can effectively reduce power consumption and an area of LSIs, for example.

What is claimed is:

1. A semiconductor integrated circuit device, comprising:
   a plurality of standard cell rows, each of which includes a plurality of standard cells arranged in a first direction, arranged in a second direction perpendicular to the first direction;
   a plurality of power supply lines extending in the first direction, and supplying power to the plurality of standard cells,
   a plurality of power supply straps extending in the second direction in a layer above the plurality of power supply lines;
   a plurality of sub-power supply straps extending in the second direction in a layer above the plurality of power supply lines and respectively connected to the plurality of power supply lines; and
   a plurality of switch cells provided between any one of the plurality of power supply straps and a set of N power supply line(s) (N is an integer of 1 or more) of the plurality of power supply lines, the plurality of switch cells switching between electrical connection and disconnection between the any one of the plurality of power supply straps and the power supply lines making the set in accordance with a control signal, wherein
   each of the plurality of power supply straps is provided with one of the plurality of switch cells arranged every M sets of power supply lines of the plurality of power supply lines (M is an integer of 3 or more), and
   in the second direction, the plurality of switch cells are arranged at different positions for the power supply straps adjacent to each other, and are arranged at the same position for every M power supply straps in the first direction.

2. The semiconductor integrated circuit device of claim 1, further comprising:
   an upper power supply line extending in the first direction in a layer above the plurality of sub-power supply straps and connected to the plurality of sub-power supply straps.

3. The semiconductor integrated circuit device of claim 1, wherein the plurality of sub-power supply straps are formed in a layer below the plurality of power supply straps.

4. The semiconductor integrated circuit device of claim 1, wherein the plurality of power supply straps overlap with the plurality of switch cells when viewed in plan.

5. The semiconductor integrated circuit device of claim 1, wherein the plurality of sub-power supply straps overlap with the plurality of switch cells when viewed in plan.

6. The semiconductor integrated circuit device of claim 1, wherein the plurality of power supply straps include two power supply straps with two or more sub-power supply straps arranged therebetween, the two or more sub-power supply straps being included in the plurality of sub-power supply straps.

7. The semiconductor integrated circuit device of claim 1, wherein the plurality of sub-power supply straps include two sub-power supply straps in different layers.

8. The semiconductor integrated circuit device of claim 1, wherein the plurality of switch cells include two switch cells having different transistor sizes.

9. A semiconductor integrated circuit device comprising:
   a plurality of standard cell rows, each of which includes a plurality of standard cells arranged in a first direction, arranged in a second direction perpendicular to the first direction;
   a plurality of power supply lines extending in the first direction, and supplying power to the plurality of standard cells,
   a plurality of power supply straps extending in the second direction in a layer above the plurality of power supply lines;
   a plurality of sub-power supply straps extending in the second direction in a layer above the plurality of power supply lines and respectively connected to the plurality of power supply lines; and
   a plurality of switch cells provided between any one of the plurality of power supply straps and a set of N power supply line(s) (N is an integer of 1 or more) of the plurality of power supply lines, the plurality of switch cells switching between electrical connection and disconnection between the any one of the plurality of power supply straps and the power supply lines making the set in accordance with a control signal, wherein
   each of the plurality of power supply straps is provided with one of the plurality of switch cells arranged every M sets of power supply lines (M is an integer of 3 or more) of the plurality of power supply lines,
   in the second direction, the plurality of switch cells are arranged at different positions for the power supply straps adjacent to each other, and are arranged at the same position for every M power supply straps in the first direction,
   the plurality of switch cells includes a first switch cell and a second switch cell which are adjacent to each other in the first direction and both provided for a same first set of N power supply lines that is one of the sets of N power supply lines, and a third switch cell provided for a second set of N power supply lines that is another one of the sets of N power supply lines adjacent to the first set of N power supply lines in the second direction, and the first, second, and third switch cells of the plurality of switch cells are provided for first, second, and third power supply straps of the plurality of power supply straps, respectively, and the third power supply strap is at a midpoint position in the first direction of the first power supply strap and the second power supply strap.

10. The semiconductor integrated circuit device of claim 9, wherein M is 4.

11. A semiconductor integrated circuit device comprising:
a plurality of standard cell rows, each of which includes a plurality of standard cells arranged in a first direction, arranged in a second direction perpendicular to the first direction;
a plurality of power supply lines extending in the first direction, and supplying power to the plurality of standard cells,
a plurality of power supply straps extending in the second direction in a layer above the plurality of power supply lines;
a plurality of sub-power supply straps extending in the second direction in a layer above the plurality of power supply lines and respectively connected to the plurality of power supply lines; and
a plurality of switch cells provided between any one of the plurality of power supply straps and a set of N power supply line(s) (N is an integer of 1 or more) of the plurality of power supply lines, the plurality of switch cells switching between electrical connection and disconnection between the any one of the plurality of power supply straps and the power supply lines making the set in accordance with a control signal, wherein
each of the plurality of power supply straps is provided with one of the plurality of switch cells arranged every M sets of power supply lines of the plurality of power supply lines (M is an integer of 3 or more),
in the second direction, the plurality of switch cells are arranged at different positions for the power supply straps adjacent to each other, and are arranged at the same position for every M power supply straps in the first direction, and
if the arrangement of the plurality of switch cells is represented by a matrix in which rows extending in an X-axis direction correspond to the set of N power supply lines and columns extending in a Y-axis direction correspond to the plurality of power supply straps, $X+Y \leq M/4$, where X represents a difference in X-coordinates between a first square provided with no switch cell and a second square provided with the switch cell and is closest to the first square, and Y represents a difference in Y-coordinates between the first square and the second square is satisfied.

12. The semiconductor integrated circuit device of claim 11, wherein M is any one of 4, 8, 12, or 16.

* * * * *